US010893358B2

United States Patent
Ukai et al.

(10) Patent No.: US 10,893,358 B2
(45) Date of Patent: Jan. 12, 2021

(54) GAIN ADJUSTMENT DEVICE, REMOTE CONVERSATION DEVICE, AND GAIN ADJUSTMENT METHOD

(71) Applicant: YAMAHA CORPORATION, Hamamatsu (JP)

(72) Inventors: Satoshi Ukai, Waltham, MA (US); Mikio Muramatsu, Fukuroi (JP)

(73) Assignee: YAMAHA CORPORATION, Hamamatsu (JP)

( * ) Notice: Subject to any disclaimer, the term of this patent is extended or adjusted under 35 U.S.C. 154(b) by 0 days.

(21) Appl. No.: 16/710,355

(22) Filed: Dec. 11, 2019

(65) Prior Publication Data
US 2020/0120420 A1    Apr. 16, 2020

Related U.S. Application Data

(63) Continuation of application No. PCT/JP2017/025163, filed on Jul. 10, 2017.

(51) Int. Cl.
*H04R 3/00* (2006.01)
*H03G 3/32* (2006.01)
*H03G 3/30* (2006.01)
*H04R 5/027* (2006.01)

(52) U.S. Cl.
CPC ........... *H04R 3/005* (2013.01); *H03G 3/3005* (2013.01); *H03G 3/32* (2013.01); *H04R 5/027* (2013.01)

(58) Field of Classification Search
CPC . H04R 3/00; H04R 3/005; H04R 3/04; H04R 1/326; H04R 2430/01; H03G 3/20; H03G 3/30; H03G 3/32; H03G 3/3005
See application file for complete search history.

(56) References Cited

U.S. PATENT DOCUMENTS

| | | | |
|---|---|---|---|
| 4,807,051 A | 2/1989 | Ogura | |
| 6,600,824 B1 | 7/2003 | Matsuo | |
| 10,425,726 B2 | 9/2019 | Takahashi | |
| 2002/0068537 A1* | 6/2002 | Shim | H04M 1/605 455/177.1 |
| 2004/0141418 A1* | 7/2004 | Matsuo | G01S 11/14 367/124 |
| 2009/0010453 A1* | 1/2009 | Zurek | G10L 21/0208 381/94.5 |

(Continued)

FOREIGN PATENT DOCUMENTS

| | | |
|---|---|---|
| JP | S6231856 B2 | 7/1987 |
| JP | S62149295 A | 7/1987 |

(Continued)

OTHER PUBLICATIONS

International Search Report issued in Intl. Appln. No. PCT/JP2017/025163 dated Aug. 15, 2017. English translation provided.

(Continued)

*Primary Examiner* — Thang V Tran
(74) *Attorney, Agent, or Firm* — Rossi, Kimms & McDowell LLP

(57) ABSTRACT

A gain adjustment method includes using a sensor to measure a physical quantity that varies according to a distance, and adjusting a level of an audio signal obtained by a microphone according to a measurement result of the sensor.

14 Claims, 12 Drawing Sheets

(56) References Cited

U.S. PATENT DOCUMENTS

| | | | |
|---|---|---|---|
| 2011/0103617 A1* | 5/2011 | Shin | H03G 3/32 |
| | | | 381/107 |
| 2011/0313763 A1* | 12/2011 | Amada | H04R 3/005 |
| | | | 704/233 |
| 2013/0188798 A1* | 7/2013 | Togawa | H04B 3/20 |
| | | | 381/66 |
| 2013/0202130 A1* | 8/2013 | Zurek | H03G 3/3005 |
| | | | 381/94.3 |
| 2014/0112483 A1 | 4/2014 | Etter | |

FOREIGN PATENT DOCUMENTS

| | | | |
|---|---|---|---|
| JP | S6382197 A | | 4/1988 |
| JP | S63262577 A | | 10/1988 |
| JP | 2001045590 A | | 2/2001 |
| JP | 2011053062 A | * | 3/2011 |
| JP | 2014216787 A | | 11/2014 |
| WO | 2017073324 A1 | | 5/2017 |

OTHER PUBLICATIONS

Written Opinion issued in Intl. Appln. No. PCT/JP2017/025163 dated Aug. 15, 2017.

* cited by examiner

GAIN ADJUSTMENT DEVICE, REMOTE CONVERSATION DEVICE, AND GAIN ADJUSTMENT METHOD

CROSS REFERENCE TO RELATED APPLICATIONS

The present application is a continuation of International Application No. PCT/JP2017/025163, filed on Jul. 10, 2017, the entire contents of which are incorporated herein by reference.

BACKGROUND OF THE INVENTION

1. Field of the Invention

Various embodiments of the present invention relate to a gain adjustment device, a remote conversation device, and a gain adjustment method that adjust a gain of an audio signal.

2. Description of the Related Art

An automatic level regulator for an audio signal disclosed in Japanese Examined Patent Publication No. S62-031856 monitors a level of an input signal, and, when a signal at a high level is inputted, attenuates the signal.

SUMMARY OF THE INVENTION

A gain adjustment device according to a preferred embodiment of the present invention includes a level adjuster, a sensor, and a setter. The level adjuster is configured to adjust a level of an audio signal obtained by a microphone. The sensor is configured to measure a physical quantity that varies according to a distance. The setter is configured to set a gain of the level adjuster according to a measurement result of the sensor.

DETAILED DESCRIPTION OF THE PREFERRED EMBODIMENTS

An automatic level regulator for an audio signal disclosed in Japanese Examined Patent Publication No. S62-031856, which adjusts the voice of a talker to a constant volume regardless of whether the talker speaks loudly or speaks quietly, adjusts the voice to the same volume even when the talker changes the volume intentionally.

An object of various embodiments of the present invention is to provide a gain adjustment device, a remote conversation device, and a gain adjustment method that are able to set a level to be constant regardless of a distance to a talker and are able to reflect a change in the volume of the talker.

A gain adjustment method according to a preferred embodiment of the present invention measures a physical quantity that varies according to a distance by a sensor, and adjusts a level of an audio signal obtained by a microphone according to a measurement result of the sensor.

According to a preferred embodiment of the present invention, a level is able to be set to be constant regardless of a distance to a talker, and a change in the volume of the talker is able to be reflected.

First Preferred Embodiment

A gain adjustment device of a first preferred embodiment includes a level adjuster, a sensor, and a setter. The level adjuster adjusts a level of an audio signal obtained by a microphone. The sensor measures a physical quantity that varies according to a distance. The setter sets a gain of the level adjuster according to a measurement result of the sensor.

The gain adjustment device of the first preferred embodiment obtains a physical quantity (for example, time from transmission to reception of electromagnetic waves, a ratio of a signal level obtained by a plurality of microphones, or the like) that varies according to a distance, and sets a gain according to the physical quantity. Therefore, the gain adjustment device is able to adjust the gain to be constant regardless of a distance to a talker. In addition, the gain adjustment device, in a case in which the distance does not change, does not change gain setting. Therefore, the gain adjustment device, in a case in which a talker changes volume intentionally, is able to reflect a change in the volume of the talker.

Figure 1:
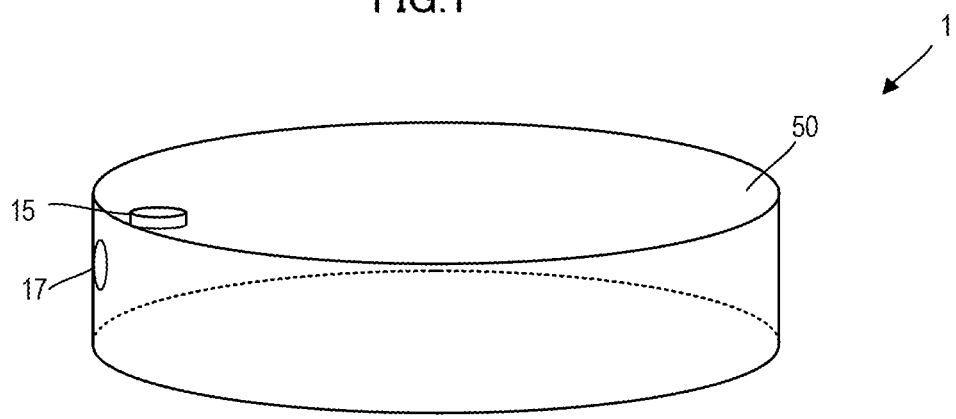
FIG. 1 is a schematic diagram showing a configuration of a sound collection device.

FIG. 1 is an external schematic diagram showing a configuration of a sound collection device 1 including a gain adjustment device. In FIG. 1, the main configuration according to sound pickup is described and other configurations are not described. The sound collection device 1 includes a housing 50 of a cylindrical shape, a microphone 15, and a sensor 17.

The microphone 15 is placed on the upper surface of the housing 50. However, the shape of the housing 50 and the placement mode of the microphone are merely examples and are not limited to these examples. The microphone 15 is a directional microphone, for example. The microphone 15 has the highest sensitivity in front (the left direction in the figure) of the device, and has no sensitivity in back (the right direction in the figure) of the device. However, the directivity of the microphone is not limited to this example.

Figure 2:
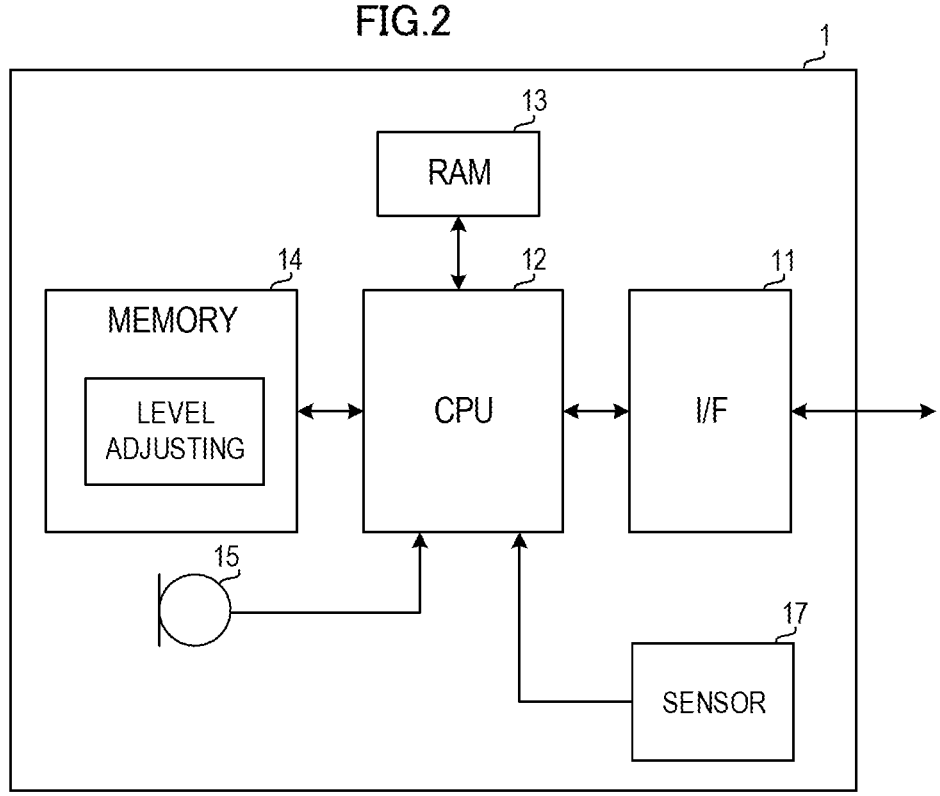
FIG. 2 is a block diagram showing a configuration of the sound collection device.

As shown in FIG. 2, the sound collection device 1 includes an interface (I/F) 11, a CPU 12, a RAM 13, a memory 14, a microphone 15, and a sensor 17.

The memory 14 includes a storage medium such as a flash memory or a hard disk drive (HDD). The memory 14 stores a program for operation of the CPU 12.

The microphone 15 obtains voice of a talker. The microphone 15 outputs an audio signal according to obtained voice, to the CPU 12. The CPU 12 performs signal processing to the audio signal inputted from the microphone 15, and outputs the audio signal to the I/F 11. It is to be noted that the sound collection device 1 may include a processor (DSP: Digital Signal Processor) dedicated for signal processing. In such a case, according to instructions of the CPU 12, the DSP performs signal processing.

The I/F 11 externally outputs the audio signal inputted from the CPU 12. The I/F 11 is a communication I/F such as a USB, for example. The I/F 11 outputs an audio signal to an information processing apparatus and the like. Alternatively, the I/F 11 outputs the audio signal to a storage (not shown). The storage records a sound collection signal obtained by the microphone 15 as recorded data.

The CPU 12, by reading a program from a memory 14 and storing the program in the RAM 13 temporarily, performs various operations. For example, CPU 12 reads a level adjusting program and performs level adjustment for adjusting a level of the audio signal obtained by the microphone 15.

Figure 3:
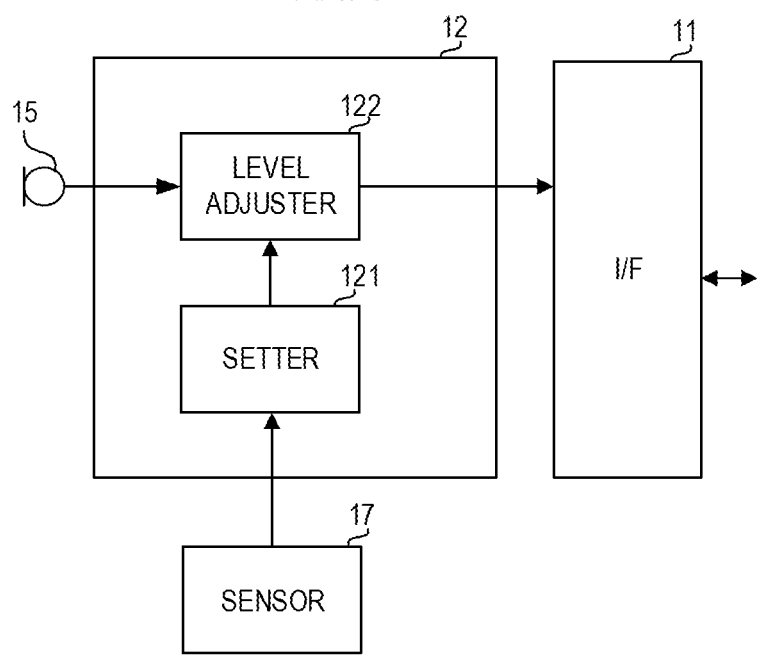
FIG. 3 is a block diagram showing a functional configuration of a CPU.

FIG. 3 is a functional block diagram of the CPU 12. The CPU 12 provides a setter 121 and a level adjuster 122 by the program. The setter 121, the level adjuster 122, and the sensor 17 achieve the gain adjustment device of the present invention.

The level adjuster 122 adjusts the level of the audio signal inputted from the microphone 15, and outputs the audio signal to the I/F 11. The level adjuster 122 sets a gain of the level adjuster 122 according to a measurement result of the sensor 17.

Figure 4:
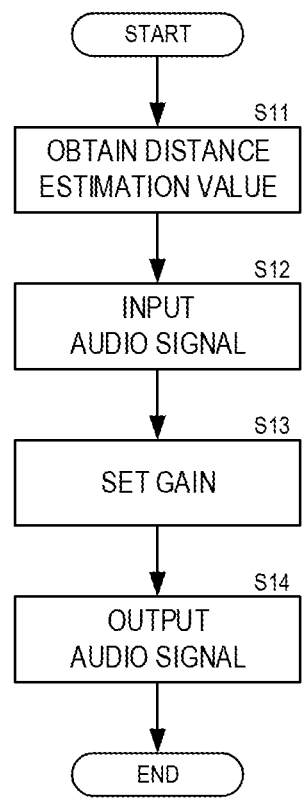
FIG. 4 is a flow chart showing an operation of the sound collection device.

FIG. 4 is a flow chart showing an operation of the CPU 12. The CPU 12 obtains a distance estimation value from the sensor 17 (S11). The level adjuster 122 of the CPU 12 receives an input of an audio signal from the microphone 15 (S12). The setter 121 sets a gain of the level adjuster 122 according to the distance estimation value (S13). The level adjuster 122 adjusts the level of the audio signal by the set gain and outputs the audio signal (S14).

The sensor 17 is a ranging sensor in this example. The ranging sensor transmits electromagnetic waves such as infrared rays, for example, and receives reflected waves. As shown in FIG. 1, the sensor 17 is installed on the side of the housing 50, for example. The sensor 17 transmits the infrared rays in front (the left direction in FIG. 1) of the device, and receives the reflected waves from a physical object (a talker in the present preferred embodiment). The sensor 17 measures a time difference between the transmission of infrared rays and the reception of the infrared rays. This time difference is an example of the physical quantity that varies according to the distance between the sensor 17 and the talker. In the present preferred embodiment, the distance between the sensor 17 and the talker is estimated by the time difference between the transmission and reception of the infrared rays. For example, a distance estimation value D is expressed by $D=(T2-T1)/C$ using transmission time T1, reception time T2, and speed C of light. The distance estimation value D may be measured by the sensor 17 or may be calculated by the CPU 12. The CPU 12 may calculate the distance estimation value D by obtaining the transmission time T1 and the reception time T2 from the sensor 17.

The level adjuster 122 sets the gain of the level adjuster 122 according to the distance estimation value D, which is based on the measurement result of the sensor 17. For example, a gain G is expressed by $G=D/Dh$ using a standard distance Dh. As a result, the gain is increased as the distance to a talker is increased. Accordingly, regardless of the distance between the microphone 15 and the talker, the audio signal at a uniform level is outputted. In addition, the gain G does not change in a case in which the distance to the talker does not change. Therefore, in a case in which a talker changes volume intentionally, the level of an audio signal also changes. Accordingly, the sound collection device 1 is able to reflect a change in the volume of the talker.

Figure 5:
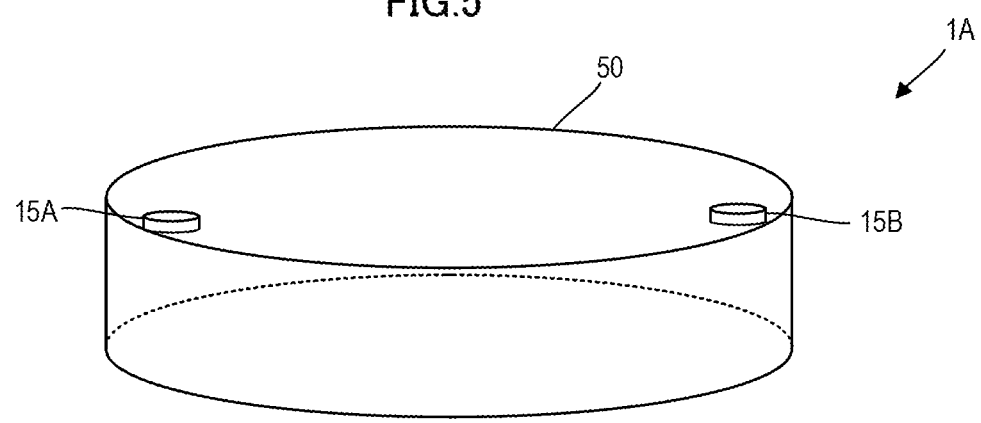
FIG. 5 is an external schematic diagram of a sound collection device 1A according to a first modification of the present invention.

FIG. 5 is an external schematic diagram of a sound collection device 1A according to a first modification of the present invention. In FIG. 5 as well, the main configuration according to sound pickup is described and other configurations are not described. The sound collection device 1A, in addition to the example of FIG. 1, includes two microphones 15A and 15B.

The microphone 15A and the microphone 15B are placed on the upper surface of the housing 50. However, the placement mode of the two microphones is an example and is not limited to this example. The microphone 15A and the microphone 15B are directional microphones, for example. The microphone 15A and the microphone 15B have the highest sensitivity in front (the left direction in the figure) of the device, and have no sensitivity in the back (the right direction in the figure) of the device. The microphone 15A is installed in front of the housing 50. The microphone 15B is installed in the back of the housing 50. The directivity of the two microphones is not limited to this example.

Figure 6:
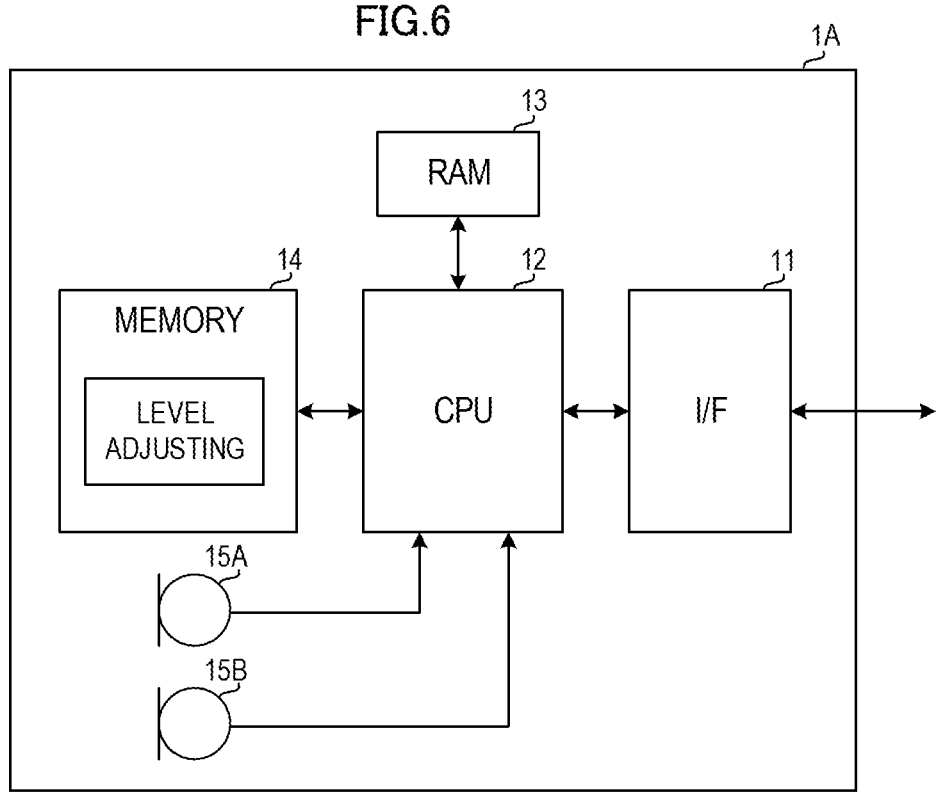
FIG. 6 is a block diagram showing a configuration of the sound collection device 1A.

FIG. 6 is a block diagram showing a configuration of the sound collection device 1A. The sound collection device 1A does not include the sensor 17, as compared with the sound collection device of FIG. 2. In addition, the sound collection device 1A, different from the sound collection device 1, includes a plurality (two in this example) of microphones, that is, the microphone 15A and the microphone 15B.

Figure 7:
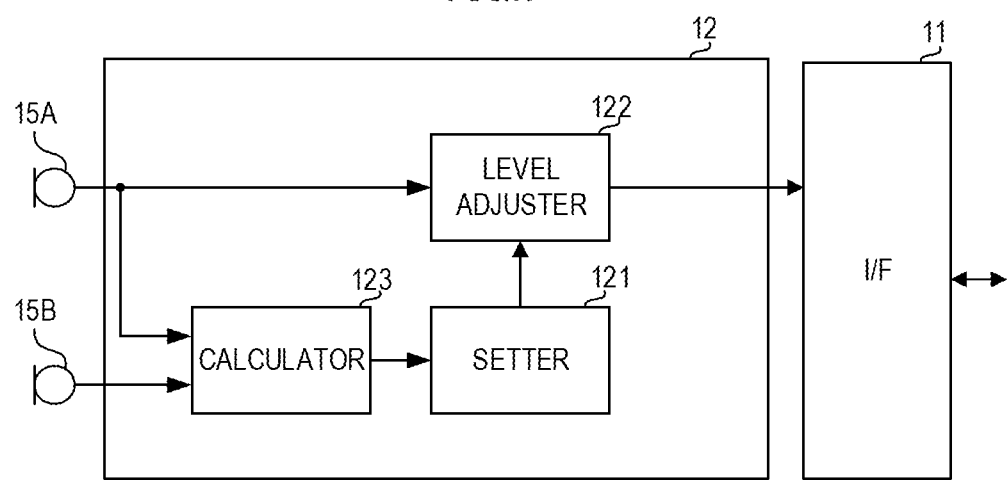
FIG. 7 is a block diagram showing a functional configuration of the CPU.

FIG. 7 is a block diagram showing a functional configuration of the CPU 12. In this example, the CPU 12 further includes a calculator 123. The calculator 123 receives an input of an audio signal from the microphone 15A and the microphone 15B. The level adjuster 122 receives an input of an audio signal from the microphone 15A.

In such a case, the microphone 15A, the microphone 15B, and the calculator 123 (software to be executed by the CPU 12) achieve the sensor of the present invention. The calculator 123 calculates a level ratio of the microphone 15A and the microphone 15B.

The calculator 123, for example, calculates power of each of the audio signal of the microphone 15A and the audio signal of the microphone 15B. In addition, the calculator 123 averages calculated power in a predetermined time range. Further, the calculator 123 divides an average power value of the audio signal of the microphone 15A by an average power value of the audio signal of the microphone 15B. This divided value corresponds to the level ratio. It is to be noted that the divided value is an example of the level ratio. The calculator 123 may calculate a level ratio from an instantaneous value of amplitude, for example.

The level of an audio signal is reduced as the distance between the microphone and a talker is reduced. Therefore, the level ratio is also an example of the physical quantity that varies according to the distance between a sensor and a talker. The setter 121 sets a gain of the level adjuster 122 according to the level ratio calculated by the calculator 123.

As described above, since the gain is increased as the distance between the microphone and the talker is increased also in the sound collection device 1A, regardless of the distance between the microphone 15A and the talker, the audio signal at a uniform level is outputted. Since the gain G does not change in a case in which the distance does not change, the sound collection device 1A is able to reflect a change in the volume of the talker.

It is to be noted that, although FIG. 7 shows the example in which the level adjuster 122 receives the input of the audio signal of the microphone 15A, the level adjuster 122 may receive an input of an audio signal of the microphone 15B and may adjust a level of the audio signal of the microphone 15B.

Figure 8:
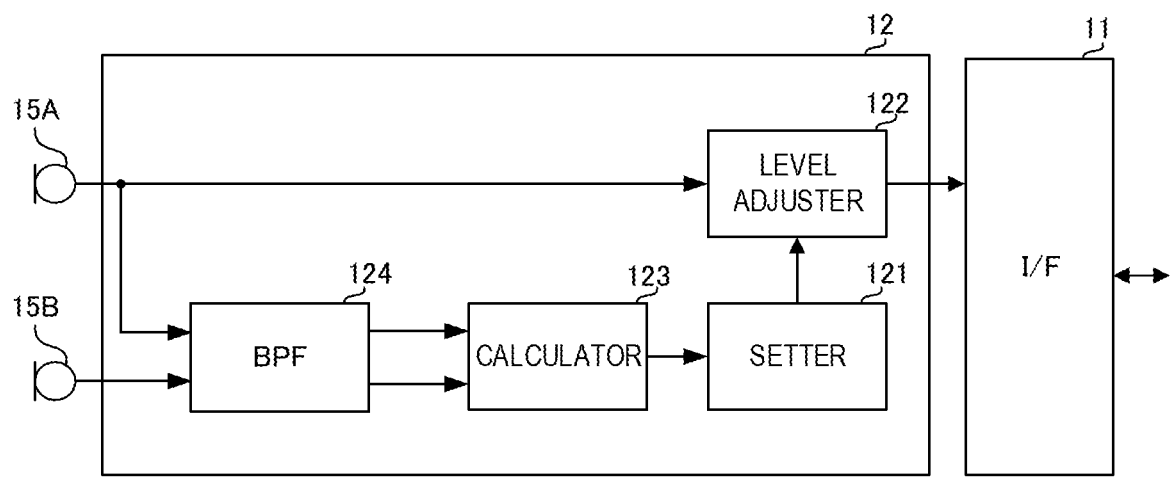
FIG. 8 is a block diagram showing a functional configuration of a CPU further including a band pass filter.

In addition, as shown in FIG. 8, the CPU 12 may further include a bandpass filter (BPF) 124. The BPF 124 extracts a predetermined band of each of the audio signal of the microphone 15A and the audio signal of the microphone 15B. The BPF 124 extracts a band of low frequency (1 kHz or less, for example) with less influence of directivity, in particular. As a result, a physical quantity is calculated by a signal of the band (band in which sound is easily diffracted) with less influence of directivity. Therefore, the CPU 12, even when an obstacle is present between the microphone 15A and the microphone 15B, for example, is able to calculate a physical quantity (a value that varies according to a distance) with high accuracy, without being influenced by the obstacle.

Figure 9:
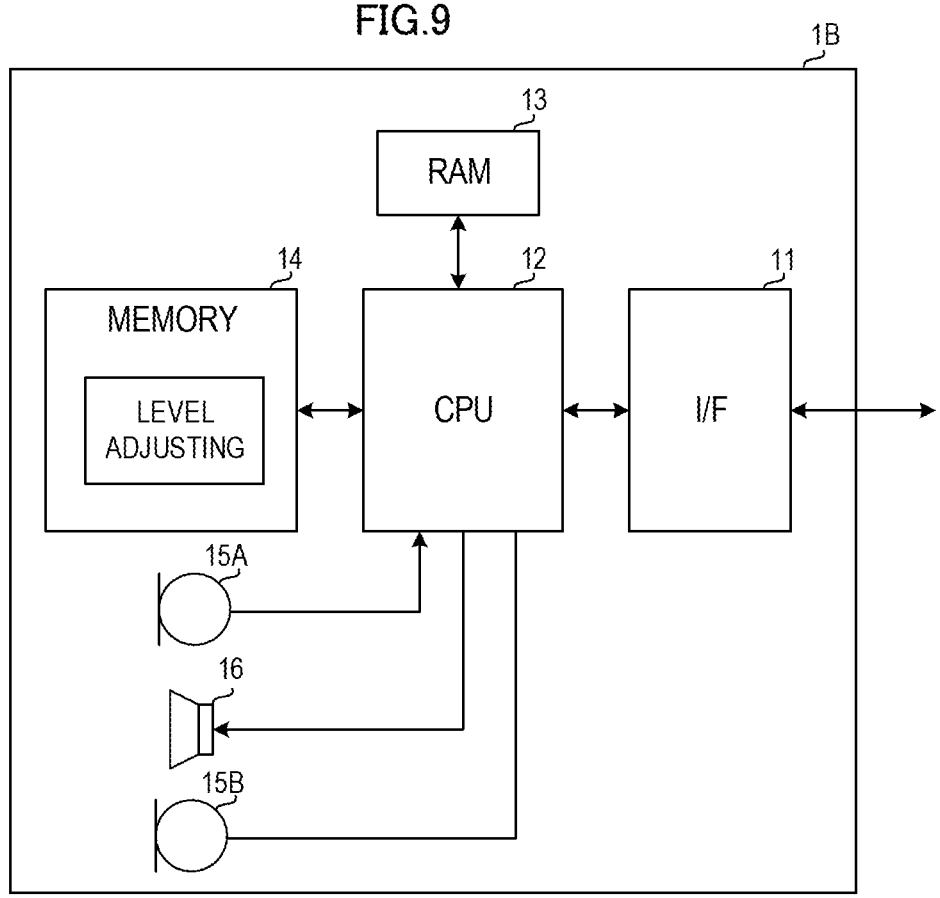
FIG. 9 is a diagram showing a sound processing device 1B further including a speaker 16.

In the above example, the sound collection device has been shown as an example of a device including the gain adjustment device of the present invention. The gain adjustment device is also able to be used for the sound processing device 1B further including the speaker 16 as shown in FIG. 9, for example.

The sound processing device 1B, in addition to the configuration of the sound collection device 1A shown in FIG. 6, further includes the speaker 16. The CPU 12 performs signal processing on an audio signal inputted from the I/F 11 and outputs the audio signal to the speaker 16. The speaker 16 outputs sound based on the audio signal inputted from the CPU 12.

Figure 10:
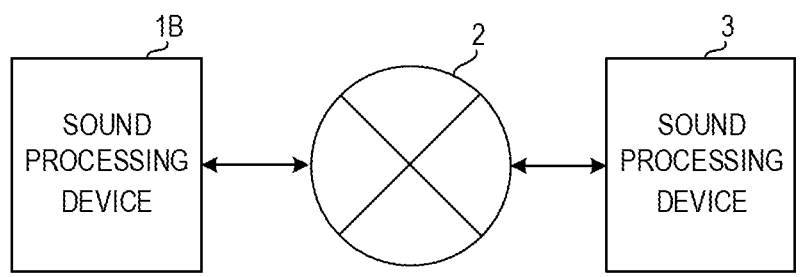
FIG. 10 is a diagram showing a configuration of a sound processing system.

For example, as shown in FIG. 10, the sound processing device 1B is connected to a sound processing device 3 installed in a remote place through a network 2, and configures a sound processing system. The sound processing device 3 has the same configuration and function as the sound processing device 1B.

In such a case, users can perform a conversation between remote places using the sound processing device 1B and the sound processing device 3. Each of the sound processing device 1B and the sound processing device 3 corresponds to a remote conversation device.

Figure 11:
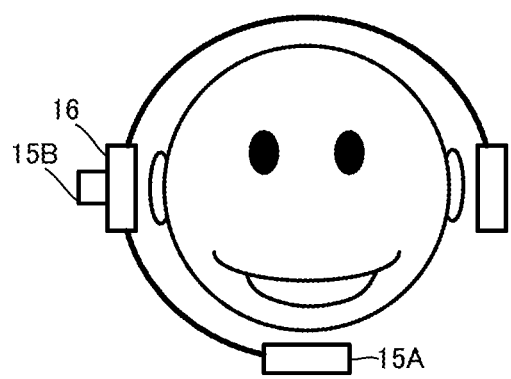
FIG. 11 is a diagram showing a headset type housing.

It is to be noted that the shape of the sound processing device 1B is not limited to a housing shape as shown in FIG. 1 and FIG. 5, and may be a headset type housing as shown in FIG. 11, for example.

In such a case, the microphone 15A is placed at the mouth of a talker, and the microphone 15B is placed near the ear (the speaker 16) away from the mouth of the talker.

It is to be noted that the above example shows an example in which the setter 121, corresponding to the physical quantity measured by the sensor, increases the gain linearly as the distance to a talker is increased, for example. However, the setter 121 may change the gain nonlinearly according to a distance to the talker. For example, indirect sound becomes dominant as the distance between the microphone and the talker is increased, and the ratio of direct sound of the talker is reduced. Accordingly, the setter 121 may increase a gain increase amount as the distance to the talker is increased.

Second Preferred Embodiment

A sound processing system of a second preferred embodiment includes a transmitting device (a sound processing device 1B) and a receiving device (a sound processing device 3) that are connected through a network. The transmitting device includes a microphone, a sensor, a sound pressure measurer, and a transmitter (an I/F 11). The sensor measures a physical quantity that varies according to a distance. The sound pressure measurer measures an input sound pressure level of the microphone. The transmitter transmits a measurement result of the sensor and a measurement result of the sound pressure measurer. The receiving device includes a receiver (the I/F 11) and an output sound pressure level adjuster. The receiver receives the measurement result of the sensor and the measurement result of the sound pressure measurer. The output sound pressure level adjuster adjusts an output sound pressure level of a speaker.

As a result, the sound processing system of the second preferred embodiment is able to reproduce a sense of distance between a talker and a microphone on a transmission side, on a reception side. In other words, in the sound processing system of the second preferred embodiment, a second user on the reception side can feel as if a first user on the transmission side is present in a space on the reception side and conversation sound has been emitted from the first user who is in the same space.

Figure 12A:
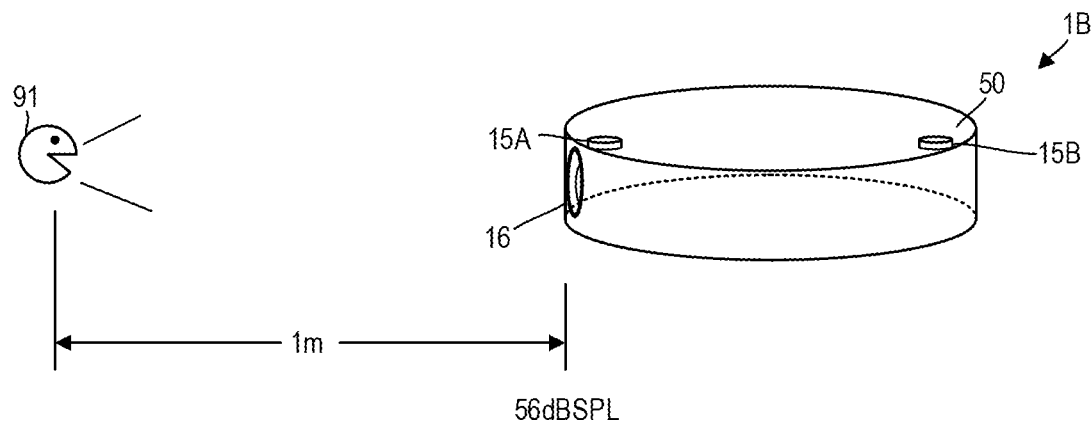
FIG. 12A is a schematic diagram showing a feature of a sound processing system according to a second preferred embodiment of the present invention.
Figure 12B:
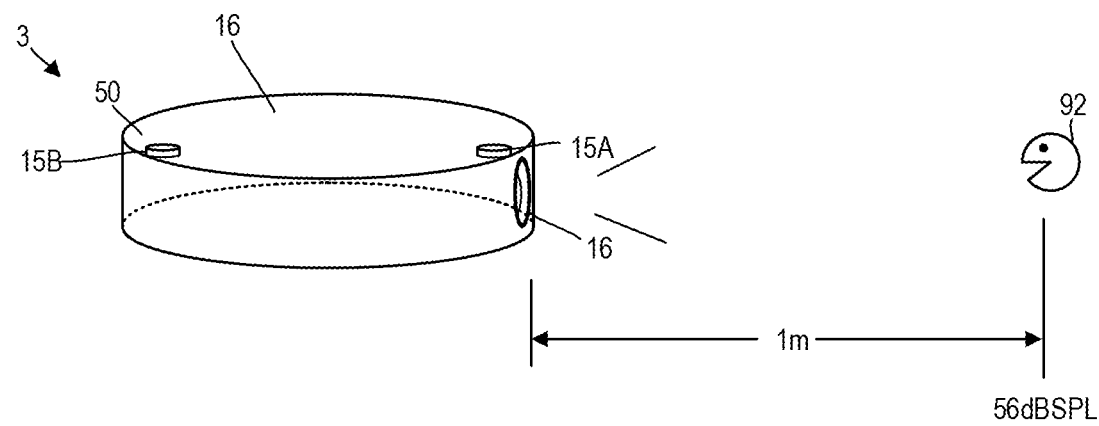
FIG. 12B is a schematic diagram showing a feature of the sound processing system according to the second preferred embodiment.

FIG. 12A and FIG. 12B are schematic diagrams showing features of the sound processing system according to the second preferred embodiment of the present invention. The sound processing system, as with FIG. 10, includes the sound processing device 1B and the sound processing device 3 that are connected through the network 2. The configuration of the sound processing device 1B on the transmission side and the sound processing device 3 on the reception side is the same as the configuration shown in the block diagram of FIG. 9. However, FIG. 12A and FIG. 12B show a configuration in which a speaker 16 is provided on the side of a housing 50 as an example.

The sound processing system of the second preferred embodiment adjusts the output sound pressure level of the speaker 16 on the reception side according to the distance between the talker and the device on the transmission side and the input sound pressure level measured by the microphone 15.

The CPU 12 of the sound processing device 1B on the transmission side corresponds to a sound pressure measurer. The CPU 12 measures the input sound pressure level of the microphone 15A, that is, sound pressure (dBSPL). The CPU 12 transmits measured sound pressure and a distance (a level ratio calculated by the calculator 123 or a physical quantity that varies according to a distance, such as time difference measured by the sensor 17, for example) to a talker, to the sound processing device 3 on the reception side. The CPU 12 of the sound processing device 3 corresponds to the output sound pressure level adjuster of the speaker, and adjusts the output sound pressure level of the speaker 16 based on the received sound pressure and the distance to a talker.

For example, as shown in FIG. 12A and FIG. 12B, a first user 91 speaks at a position 1 m away from the microphone 15A. The sound pressure measured by the microphone 15A is set to 56 dBSPL. In the sound processing device 3 on the reception side, the output sound pressure level of the speaker 16 is adjusted to the output sound pressure level of 56 dBSPL at a position of a second user 92 who is present 1 m away from the speaker 16. The level-adjusted voice of the first user 91 reaches the second user 92. For example, a distance between the microphone 15A and speaker 16 of the sound processing device 3 is fixed. Therefore, the CPU 12, when measuring the output sound pressure level of the speaker 16 at such a fixed distance, is able to calculate an attenuation adjustment factor to obtain an arbitrary output sound pressure level at a position of the user. For example, when the distance between the microphone 15A and the speaker 16 is 5 cm and the output sound pressure level is set to 82 dBSPL at the position of the microphone 15A, the output sound pressure level is 56 dBSPL at a position 1 m away.

In this manner, the sound processing system of the second preferred embodiment, on the reception side, adjusts the output sound pressure level of the speaker so as to reproduce the distance to the talker on the transmission side. Accordingly, in the sound processing system of the second preferred embodiment, the second user on the reception side can feel as if the conversation sound has been emitted from the first user who is in the same space.

It is to be noted that, also in the second preferred embodiment, the gain adjustment according to a distance may be performed on the transmission side and the output sound pressure level of the speaker may be adjusted on the reception side.

Finally, the foregoing preferred embodiments are illustrative in all points and should not be construed to limit the present invention. The scope of the present invention is defined not by the foregoing preferred embodiment but by the following claims. Further, the scope of the present invention is intended to include all modifications within the scopes of the claims and within the meanings and scopes of equivalents. For example, the sensor may include a camera and calculate the size of an image captured by the camera as a physical quantity. In this case as well, the setter 121 sets a gain of the level adjuster 122 according to the physical quantity measured by the sensor.

What is claimed is:

1. A gain adjustment device comprising:
    a sensor configured to measure a physical quantity that varies according to a distance;
    at least one memory configured to store instructions; and
    at least one processor configured to execute the instructions to:
        extract a predetermined low band of an input signal from a microphone, the predetermined low band of the input signal having a lower influence of directivity than other bands of the input signal;
        obtain a measurement result of the sensor based on the predetermined low band of the input signal; and
        adjust a level of an audio signal obtained by the microphone according to the obtained measurement result of the sensor.

2. The gain adjustment device according to claim 1, wherein the physical quantity varies according to a distance between the microphone and a sound source.

3. The gain adjustment device according to claim 1, wherein the sensor includes a plurality of microphones and measures a level ratio in the plurality of microphones as the physical quantity.

4. A gain adjustment device comprising:
    a level adjuster configured to adjust a level of an audio signal obtained by a microphone;
    a sensor configured to measure a physical quantity that varies according to a distance; and
    a setter configured to extract a predetermined low band of an input signal from the microphone, the predetermined low band of the input signal having a lower influence of directivity than other bands of the input signal, obtain a measurement results of the sensor based on the extracted predetermined low band, and set a gain of the level adjuster according to the obtained measurement result of the sensor.

5. The gain adjustment device according to claim 4, wherein the physical quantity varies according to a distance between the microphone and a sound source.

6. The gain adjustment device according to claim 4, wherein the sensor includes:
    a plurality of microphones; and
    a calculator configured to calculate a level ratio in the plurality of microphones as the physical quantity.

7. The gain adjustment device according to claim 6, further comprising a filter configured to extract the predetermined low band of the input signal from each microphone of the plurality of microphones and provide the extracted predetermined low band from each microphone to the calculator.

8. The gain adjustment device according to claim 4, wherein the setter is configured to set the gain to be non-linear according to the physical quantity.

9. A remote conversation device comprising:
    a gain adjustment device comprising:
        a sensor configured to measure a physical quantity that varies according to a distance;
        at least one memory configured to store instructions; and
        at least one processor configured to execute the instructions to:
            extract a predetermined low band of an input signal from a microphone, the predetermined low band of the input signal having a lower influence of directivity than other bands of the input signal;
            obtain a measurement result of the sensor based on the predetermined low band of the input signal; and
            adjust a level of an audio signal obtained by the microphone according to the obtained measurement result of the sensor; and
    a speaker.

10. A gain adjustment method comprising:
    using a sensor to measure a physical quantity that varies according to a distance;
    extracting a predetermined low band of an input signal from a microphone, the predetermined low band of the input signal having a lower influence of directivity than other bands of the input signal;
    obtaining a measurement result of the sensor based on the predetermined low band of the input signal; and
    adjusting a level of an audio signal obtained by the microphone according to the obtained measurement result of the sensor.

11. The gain adjustment method according to claim 10, wherein the physical quantity varies according to a distance between the microphone and a sound source.

12. The gain adjustment method according to claim 10, further comprising calculating a level ratio in a plurality of microphones included in the sensor as the physical quantity.

13. The gain adjustment method according to claim 12, further comprising extracting the predetermined low band of the input signal from each microphone of the plurality of microphones and calculating the level ratio based on the extracted predetermined low band from each microphone.

14. The gain adjustment method according to claim 10, further comprising setting the level of the audio signal to be non-linear according to the physical quantity.

* * * * *